US008766365B2

(12) United States Patent
Smith

(10) Patent No.: US 8,766,365 B2
(45) Date of Patent: Jul. 1, 2014

(54) CIRCUIT-PROTECTION DEVICES

(75) Inventor: Mike Smith, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/400,678

(22) Filed: Feb. 21, 2012

(65) Prior Publication Data
US 2013/0214359 A1 Aug. 22, 2013

(51) Int. Cl.
*H01L 23/62* (2006.01)
(52) U.S. Cl.
USPC ............. 257/355; 361/56; 257/368; 257/360; 257/501; 257/401; 257/500
(58) Field of Classification Search
USPC ......... 257/213, 288, 327, 355, 357, 360, 361, 257/363, 368, 346, 347, 348, 500, 504, 549, 257/550, 553, 556, 557, 55, 43, 401; 361/91.1, 56
See application file for complete search history.

(56) References Cited

U.S. PATENT DOCUMENTS

| | | | | |
|---|---|---|---|---|
| 4,916,333 A * | 4/1990 | Kowalski | | 326/68 |
| 5,095,228 A | 3/1992 | Galbraith et al. | | |
| 5,446,303 A * | 8/1995 | Quill et al. | | 257/360 |
| 5,597,758 A * | 1/1997 | Heim et al. | | 438/527 |
| 5,641,697 A * | 6/1997 | Iwanami | | 438/294 |
| 5,714,784 A * | 2/1998 | Ker et al. | | 257/360 |
| 6,121,643 A * | 9/2000 | Gardner et al. | | 257/202 |
| 6,163,058 A * | 12/2000 | Williamson et al. | | 257/401 |
| 6,292,391 B1 * | 9/2001 | Nojima | | 365/185.05 |
| 6,917,076 B2 * | 7/2005 | Eguchi et al. | | 257/340 |
| 7,078,286 B1 | 7/2006 | Mehta | | |
| 7,119,413 B2 * | 10/2006 | Kutsukake et al. | | 257/508 |
| 7,173,861 B2 | 2/2007 | Cho et al. | | |
| 7,230,299 B2 * | 6/2007 | Robb et al. | | 257/337 |
| 7,499,327 B2 | 3/2009 | Kwak et al. | | |
| 7,572,699 B2 * | 8/2009 | Hong et al. | | 438/257 |
| 2002/0056885 A1 * | 5/2002 | Kita et al. | | 257/499 |
| 2004/0057172 A1 * | 3/2004 | Sun | | 361/56 |
| 2005/0002141 A1 * | 1/2005 | Reynders et al. | | 361/91.1 |
| 2007/0063312 A1 * | 3/2007 | Takemoto | | 257/529 |
| 2008/0232009 A1 * | 9/2008 | Ikegami | | 361/56 |
| 2009/0194841 A1 * | 8/2009 | Magome et al. | | 257/501 |
| 2011/0063763 A1 * | 3/2011 | Alvarez et al. | | 361/56 |
| 2011/0127526 A1 * | 6/2011 | Kawae et al. | | 257/43 |
| 2011/0140227 A1 * | 6/2011 | Smith et al. | | 257/500 |
| 2011/0180867 A1 * | 7/2011 | Tsang | | 257/329 |
| 2012/0007193 A1 * | 1/2012 | Lee et al. | | 257/401 |
| 2012/0094458 A1 * | 4/2012 | Cai | | 438/286 |
| 2012/0182654 A1 * | 7/2012 | Wang et al. | | 361/56 |

OTHER PUBLICATIONS

Mikhalev et al., A Novel Depletion Mode High Voltage Isolation Device, 2010, IEEE, p. 1-3.*
Mikhalev, V., et al., "A Novel depletion Mode High Voltage Isolation Device," IEEE Xplore Digital Library, Microelectronics and Electron Devices (WMED), 2010 IEEE Workshop, Apr. 16-16, 2010, pp. 1-3.

* cited by examiner

*Primary Examiner* — Bac Au
*Assistant Examiner* — Sophia Nguyen
(74) *Attorney, Agent, or Firm* — Dicke, Billig & Czaja, PLLC

(57) ABSTRACT

In an embodiment, a circuit-protection device has first and second circuit-protection units, each comprising first and second nodes. A gate is between the first nodes of first and second circuit-protection units. The first nodes of first and second circuit-protection units are on a common active region.

31 Claims, 11 Drawing Sheets

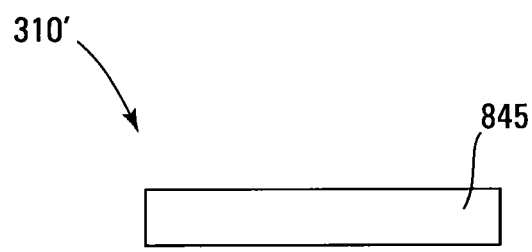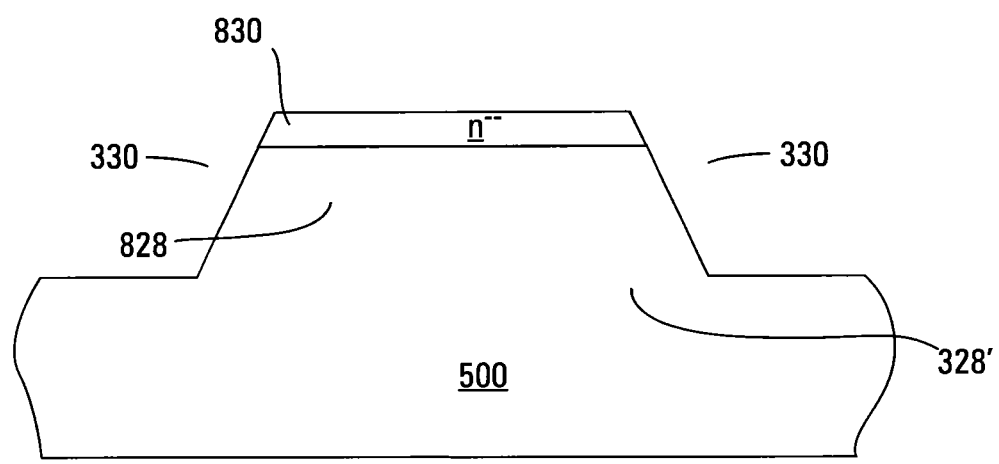
FIG. 9

CIRCUIT-PROTECTION DEVICES

FIELD

The present disclosure relates generally to circuit protection, and, in particular, the present disclosure relates to circuit-protection devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the memory cells, through programming (which is sometimes referred to as writing) of charge-storage structures (e.g., floating gates or charge traps) or other physical phenomena (e.g., phase change or polarization), determine the data value of each memory cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are coupled in parallel with each memory cell coupled to a data line, such as a bit line. A "column" refers to a group of memory cells that are commonly coupled to a local data line, such as a local bit line. It does not require any particular orientation or linear relationship, but instead refers to the logical relationship between memory cell and data line.

Typically, the array of memory cells for NAND flash memory devices is arranged such that the control gate of each memory cell of a row of the array is connected together to form an access line, such as a word line. Columns of the array include strings (often termed NAND strings) of memory cells connected together in series, e.g., source to drain, between a pair of select lines, e.g., a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

Data lines are sometimes coupled to circuitry that may be configured to handle relatively low voltages (e.g., that may be referred to as low-voltage circuitry), such as data cache circuitry. The low-voltage circuitry may provide relatively low voltages (e.g., 0 (zero) V up to about 4 V) to the data lines during read or write operations.

However, during erase operations (e.g., involving NAND memory arrays), memory cells may be erased a block at a time by grounding all of the access lines in the block, for example, while allowing the data lines to float. A relatively high erase voltage (e.g., about 20 to 30 V) is then applied to a semiconductor on which the memory cells are formed, and thus to the channels of the memory cells, to remove the charge from the charge-storage structures. This can cause the data lines to float to about the erase voltage and can damage the low-voltage circuitry coupled to data lines.

Therefore, circuit-protection devices, such as field-effect transistors (FETs), may be coupled between the data lines and the low-voltage circuitry for protecting the low-voltage circuitry from the relatively high voltages that may be present on the data lines during an erase operation. The circuit-protection devices may be coupled on a one-to-one basis to the data lines or one circuit-protection device to two or more data lines through a multiplexer. However, the pitch of the circuit-protection devices may be relatively large in order to avoid breakdown of the circuit-protection devices. For example, the relatively large pitch uses up considerable area and thus may increase the size of the memory device.

For the reasons stated above, and for other reasons stated below which will become apparent to those skilled in the art upon reading and understanding the present specification, there is a need in the art for alternative circuit-protection devices that allow for smaller pitches.

BRIEF DESCRIPTION OF THE DRAWINGS

FIG. 9 is a cross-section taken along line 9-9 in FIG. 4B.

DETAILED DESCRIPTION

Figure 1:
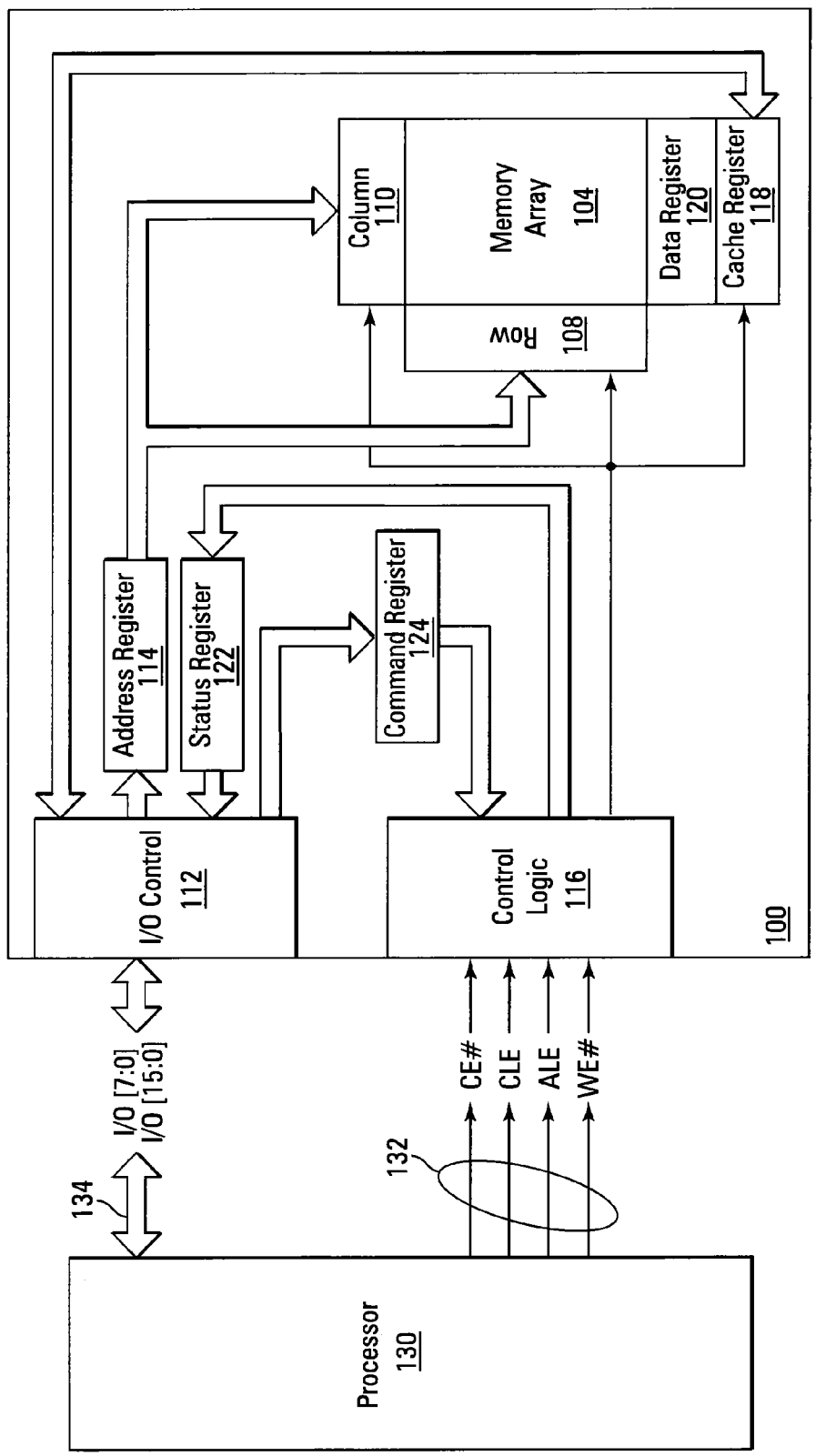
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS)

technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

A circuit-protection device, according to various embodiments, may be between data register 120 and memory array 104. For example, low-voltage circuitry of data register 120 and/or data cache 118 may be coupled to one side (e.g., a low-voltage side) of the circuit-protection device and data lines of memory array 104 may be coupled to another side (e.g., a high-voltage side) of the circuit-protection device.

In some embodiments, a circuit-protection device may have first and second circuit-protection units, each having first and second nodes. The first nodes of the first and second circuit-protection units are on a common active region and may be coupled to data lines of memory array 104. The second nodes of the first and second circuit-protection units may be coupled to the low-voltage circuitry. A gate may be between the first nodes of first and second circuit-protection units. The gate may be configured to electrically isolate the first nodes of first and second circuit-protection units from each other while memory array 104 is being read from or written to and may be configured to couple the first nodes of first and second circuit-protection units while memory array 104 is being erased. The first and second circuit-protection units may be configured to electrically isolate the data lines from the low-voltage circuitry while memory array 104 is being erased and couple the data lines to the low-voltage circuitry while memory array 104 is being read from or written to.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O at control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
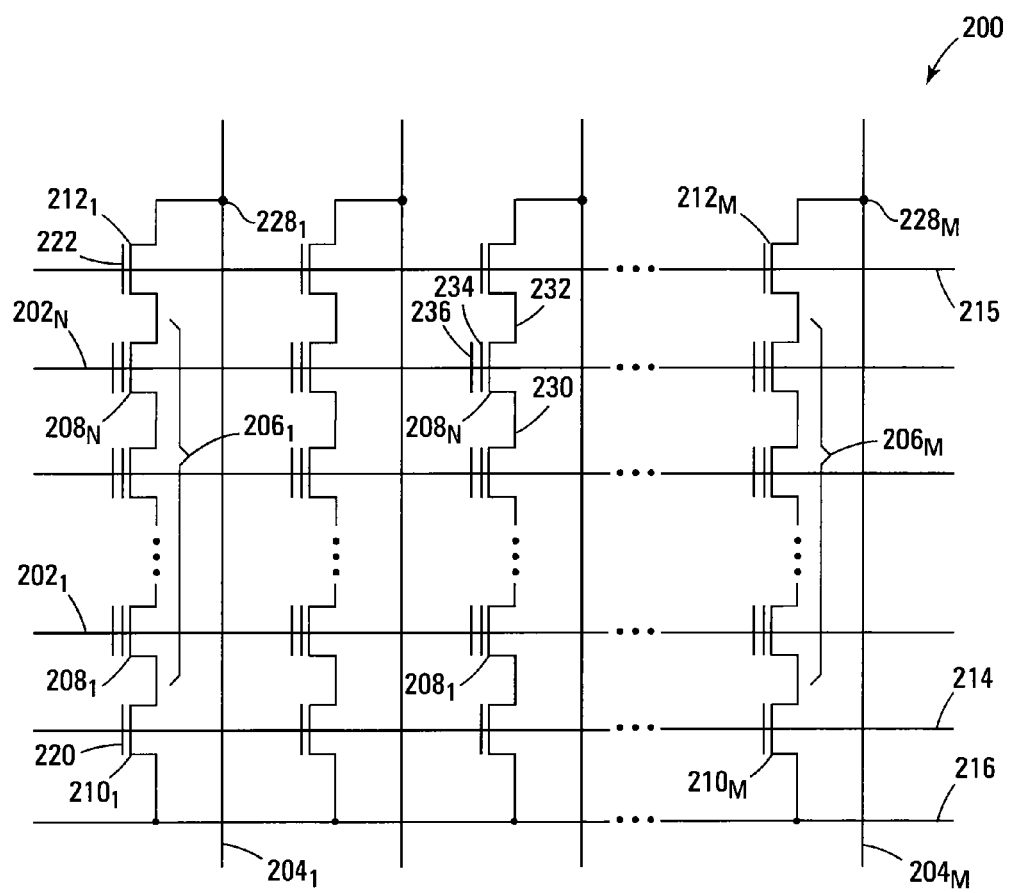
FIG. 2 is a schematic of a NAND memory array, according to another embodiment.

FIG. 2 is a schematic of a NAND memory array 200, e.g., as a portion of memory array 104, in accordance with another embodiment. Memory array 200 includes access lines, such as word lines $202_1$ to $202_N$, and intersecting data lines, such as bit lines $204_1$ to $204_M$. For ease of addressing in the digital environment, the number of word lines 202 and the number of bit lines 204 are each some power of two, e.g., 256 word lines 202 by 4,096 bit lines 204. The bit lines 204 may be coupled to global data lines, such as global bit lines (not shown), in a many-to-one relationship.

Memory array 200 is arranged in rows (each corresponding to a word line 202) and columns (each corresponding to a bit line 204). Each column may include a string, such as one of NAND strings $206_1$ to $206_M$. Each NAND string 206 is coupled to a common source line 216 and includes memory cells $208_1$ to $208_N$, each located at an intersection of a word line 202 and a bit line 204. The memory cells 208 represent non-volatile memory cells for storage of data. The memory cells 208 of each NAND string 206 are connected in series, source to drain, between a source select line 214 and a drain select line 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216. The drain of each source select gate 210 is connected to the source of the memory cell 208 of the corresponding NAND string 206. For example, the drain of source select gate $210_1$ is connected to the source of memory cell $208_1$ of the corresponding NAND string $206_1$. Therefore, each source select gate 210 selectively couples a corresponding NAND string 206 to common source line 216. A control gate 220 of each source select gate 210 is connected to source select line 214.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of a memory cell $208_N$ of the corresponding NAND string 206. For example, the source of drain select gate $212_1$ is connected to the drain of memory cell $208_N$ of the corresponding NAND string $206_1$. Therefore, each drain select gate 212 selectively couples a corresponding NAND string 206 to a corresponding bit line 204. A control gate 222 of each drain select gate 212 is connected to drain select line 215.

Typical construction of memory cells 208 includes a source 230 and a drain 232, a charge-storage structure 234 (e.g., a floating gate, charge trap, etc.) that can store a charge that determines a data value of the memory cell, and a control gate 236, as shown in FIG. 2. Memory cells 208 have their control gates 236 coupled to (and in some cases from) a word line 202. A column of the memory cells 208 is a NAND string 206 coupled to a given bit line 204. A row of the memory cells 208 are those memory cells commonly coupled to a given word line 202.

Although the examples of FIGS. 1 and 2 were discussed in conjunction with NAND flash, the embodiments described herein are not limited to NAND flash, but can include other flash architectures, such as NOR flash, etc.

Circuit-protection devices, such as field-effect transistors, may be coupled between the bit lines and low-voltage circuitry, such as the low-voltage circuitry of data cache 118 and/or the low-voltage circuitry of data register 120, to protect the low-voltage circuitry from the relatively high voltages that may be present on the bit lines during an erase operation. For example, a field-effect transistor may be turned off during an erase operation to protect the low-voltage circuitry from the relatively high voltages that may be present on the bit lines, and on during a read or write operation to pass the relatively low voltages between the low-voltage circuitry and the bit lines.

Each circuit-protection device may be formed on an active region that is separated and electrically isolated from an adjacent active region, on which an adjacent circuit-protection device is formed, by an isolation region, such as a shallow-trench isolation (STI) region. A bit line may be coupled to a high-voltage side of a circuit-protection device, and the low-voltage circuitry may be coupled to a low-voltage side of a circuit-protection device. For example, for a field-effect transistor, a contact (e.g., that may be referred to as a high-voltage-side contact) may couple a bit line to a source/drain region on the high-voltage side, and a contact (e.g., that may be referred to as a low-voltage-side contact) may couple low-voltage circuitry to a source/drain region on the low-voltage side. However, the pitch of the field-effect transistors may be relatively large, owing to the relatively large distance between the high-voltage-side contact and the edges of the active region on the high-voltage side that may be needed to avoid breakdown during an erase operation.

Figure 3:
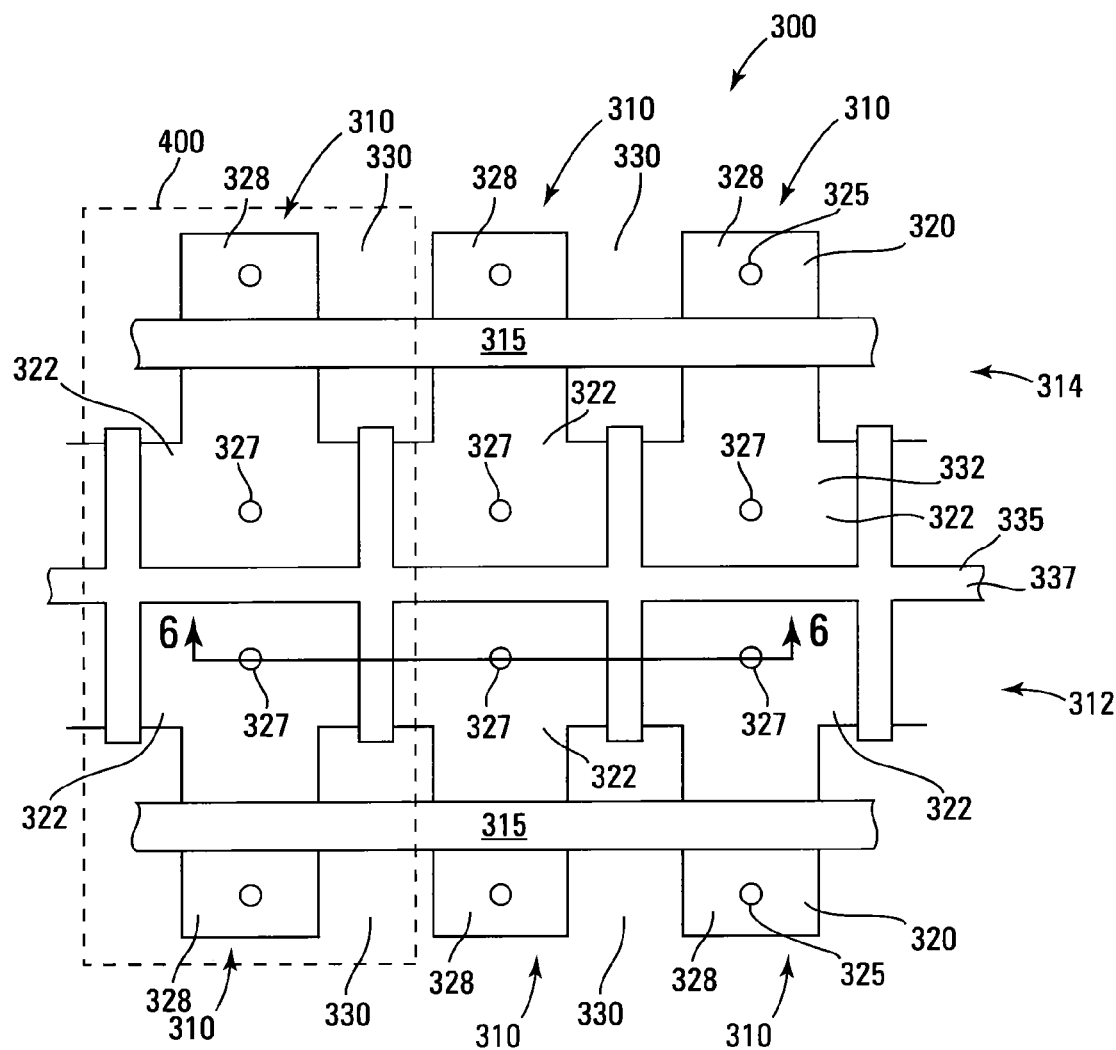
FIG. 3 is a top plan view of a circuit-protection device, according to another embodiment.

FIG. 3 is a top plan view of a circuit-protection device 300, e.g., that may also be referred to as a high-voltage isolation device. Circuit-protection device 300 may include a plurality of circuit-protection (e.g., high-voltage isolation) units 310. For example, circuit-protection device 300 may include a row 312 of circuit-protection units 310 and a row 314 of circuit-protection units 310. A row 312 of circuit-protection units 310 are those circuit-protection units 310 commonly coupled to a control line 315 and a row 314 of circuit-protection units 310 are those circuit-protection units 310 commonly coupled to another control line 315.

Figure 4:
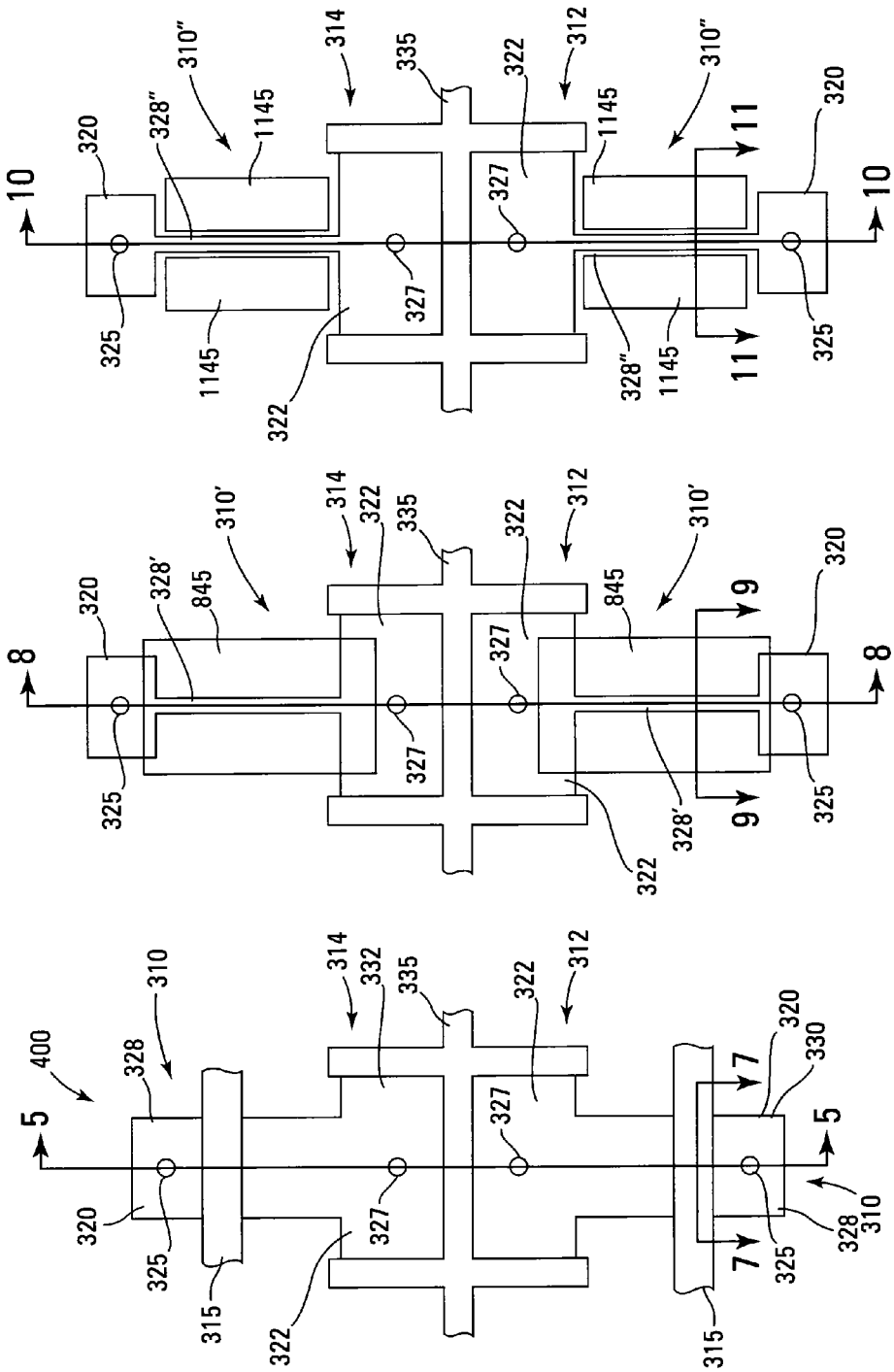
FIG. 4A is an enlarged view of the region 400 of FIG. 3.
FIG. 4B is a top plan view of a circuit-protection unit, according to another embodiment.
FIG. 4C is a top plan view of a circuit-protection unit, according to another embodiment.

FIG. 4A is an enlarged view of the region 400 of FIG. 3. Region 400 includes a circuit-protection unit 310 from each of rows 312 and 314. Each circuit-protection unit 310 may include a side (e.g., low-voltage side) that may include a node 320 (e.g., a low-voltage node) that may be coupled to low-voltage circuitry, such as data cache 118 and/or data register 120 (FIG. 1). Each circuit-protection unit 310 may include a side (e.g., high-voltage side, such as a bit-line side) that may include a node 322 (e.g., a high-voltage node) that may be coupled to circuitry that can be at a relatively high voltage (e.g., about 20 to about 30 V) or a relatively low voltage (e.g., about zero (0) to about 4 V), such as a bit line 204 (FIG. 2). For example, a node 320 may include a contact 325 that may be coupled to low-voltage circuitry and a node 322 may include a contact 327 that may be coupled to a bit line.

In other words, each circuit-protection unit 310 may selectively couple a node 320 to a node 322. That is, circuit-protection unit 310 may be between and coupled to a node 320 and a node 322.

Nodes 320 may be respectively formed in individual active regions 328 that are defined in a semiconductor by isolation regions 330, e.g., STI regions, formed in the semiconductor on either side of a given individual active region 328. In other words, an isolation region 330 is between adjacent active regions 328, respectively corresponding to adjacent nodes 320 of adjacent circuit-protection units 310 in each of rows 312 and 314. Each isolation region 330 electrically isolates and physically separates its adjacent active regions 328, and thus adjacent nodes 320, from each other. The semiconductor may be comprised of silicon, e.g., monocrystalline silicon, and, for example, may be conductively doped to have a conductivity type, e.g., a p-type conductivity, e.g., to form a p-well.

Nodes 322 of the circuit-protection units 310 of rows 312 and 314 are formed in a single (e.g., in a common) active region 332. That is, nodes 322 are not electrically isolated from or physically separated from each other by isolation regions formed in the semiconductor. Instead, nodes 322 are selectively electrically coupled to each other by a gate 335 (e.g., that may be referred to as an isolation gate) formed over active region 332. Active regions 328 may be contiguous with active region 332. That is, active regions 328 may extend from active region 332, as shown in FIGS. 3 and 4A for some embodiments.

For example, when nodes 322 are at relatively high voltages (about 20 to 30 V), e.g., during an erase operation, gate 335 may be selectively allowed to float or a relatively high voltage may be selectively applied to gate 335 so that the nodes 322 are electrically coupled. That is, gate 335 may be turned on to electrically couple nodes 322. During an erase operation, the bit lines, and thus the nodes 322 coupled to the bit lines, will be at about the erase voltage concurrently and thus there is no need to electrically isolate nodes 322 from each other.

When nodes 322 are at relatively high voltages, circuit-protection units 310 act to prevent the relatively high voltages from being passed to nodes 320 and thus to the low-voltage circuitry coupled to nodes 320. In other words, when nodes 322 are at relatively high voltages, circuit-protection units 310 electrically isolate nodes 322, and thus the bit lines, from nodes 320, and thus the low-voltage circuitry. For example, circuit-protection units 310 may be turned off to electrically isolate nodes 322 from nodes 320.

However, when nodes 322 are at relatively low voltages (about 0 (zero) to 4 V), e.g., during a read or write operation, gate 335 may be selectively grounded so that the nodes 322 are electrically isolated from each other. That is, gate 335 may be turned off to electrically isolate nodes 322. When nodes 322 are at relatively low voltages turning gate 335 off, e.g., by grounding gate 335, provides sufficient isolation between nodes 322. This avoids the need to form isolation (e.g., STI) regions in the semiconductor to create separate active regions with the isolation regions therebetween so that each active region includes one node 322. Forming isolation regions in the semiconductor to form separate active regions so that each active region includes one node 322 can increase the distance between adjacent nodes, and thus the pitch of circuit-protection units 310, as compared to when multiple nodes 322 are formed on a single active region with gate 335 between adjacent nodes.

For example, during a read or a write operation, a circuit-protection unit 310 may be turned on when the node 322 coupled thereto is at a low voltage and when adjacent nodes 322 (e.g., vertically, horizontally, and/or diagonally in FIG. 3) are coupled to circuit-protection units 310 that are off. In such an example, turning gate 335 off acts to electrically isolate the node 322 coupled to the circuit-protection unit 310 that is on from the adjacent nodes 322 coupled circuit-protection units 310 that are off. As such, turning gate 335 off acts to electrically isolate adjacent nodes 322 that may be at different voltages.

Note that portions of gate 335 surround at least a portion of each node 322. That is, the portions of gate 335 may define nodes 322.

Figure 5:
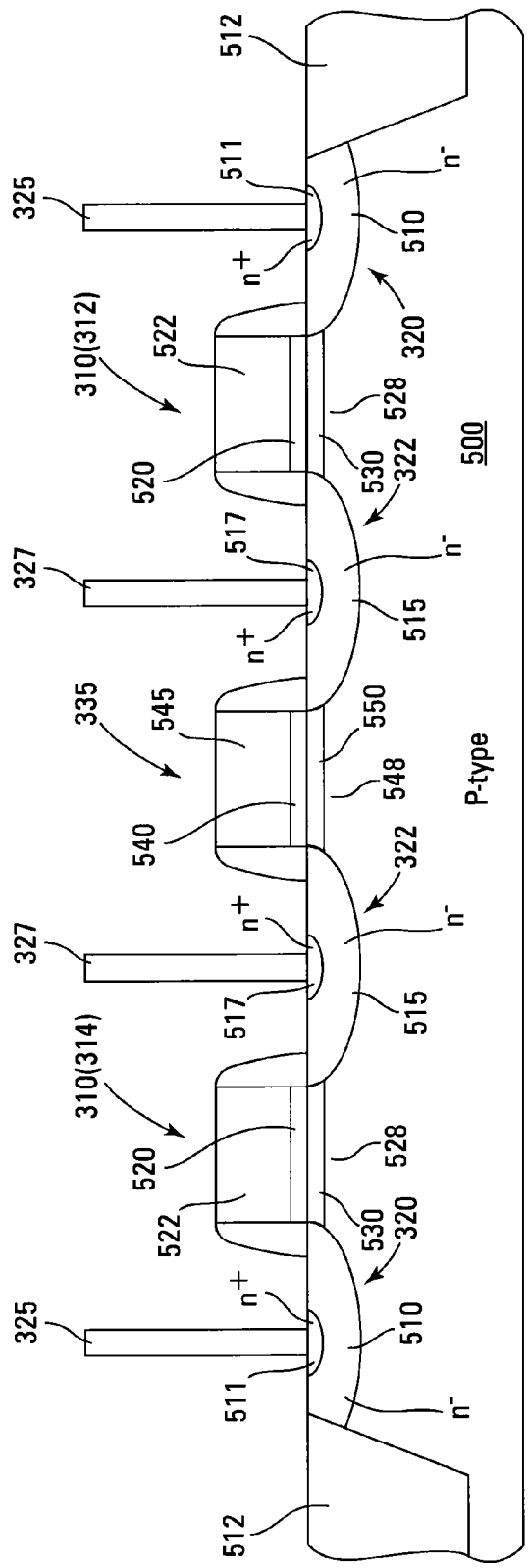
FIG. 5 illustrates a cross-section taken along line 5-5 in FIG. 4A.
Figure 6:
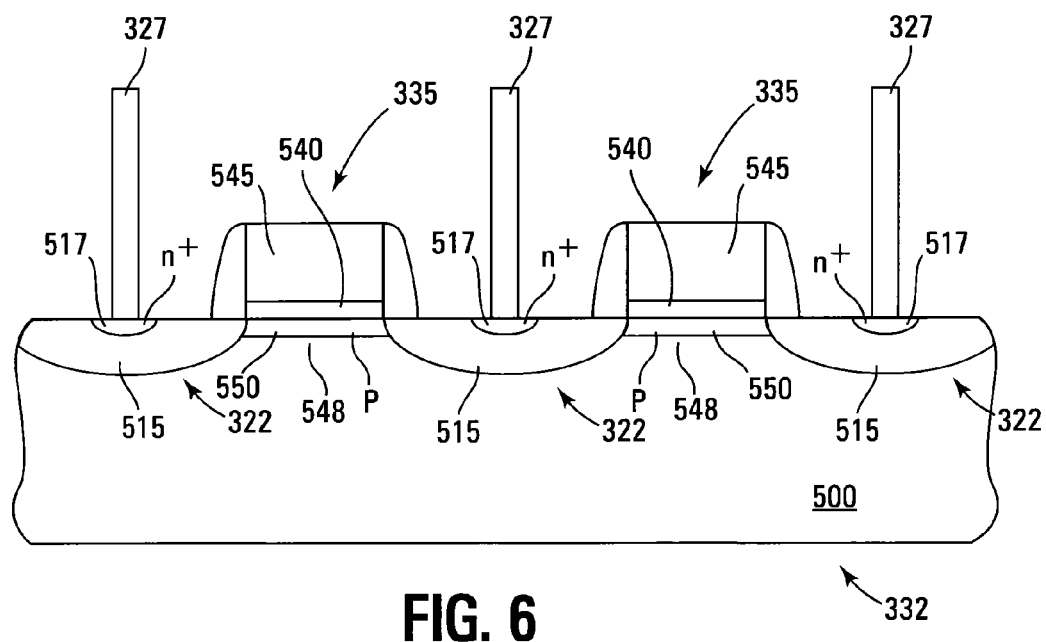
FIG. 6 illustrates a cross-section taken along line 6-6 of FIG. 3.
Figure 7:
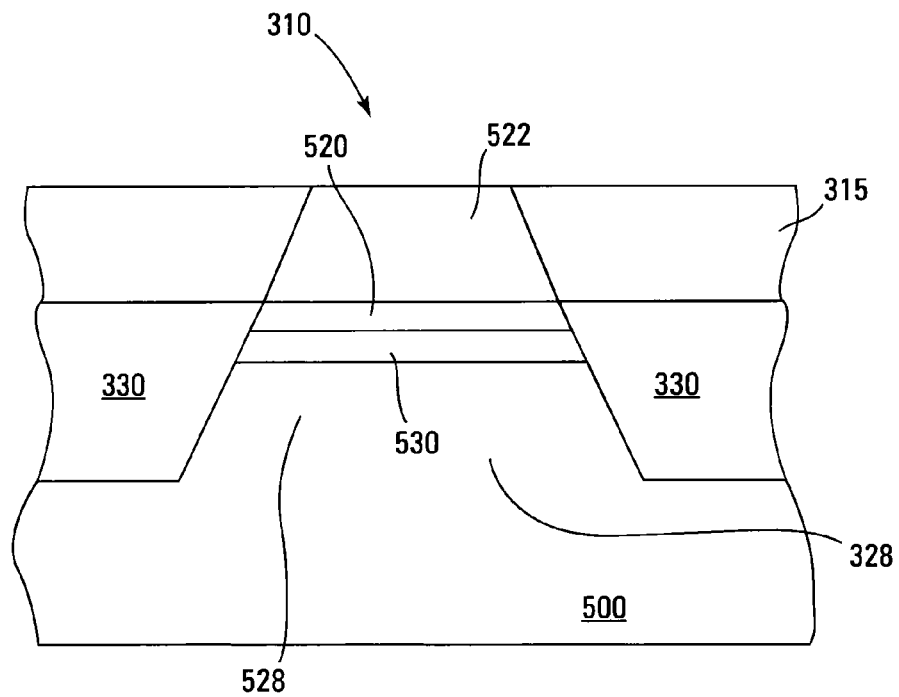
FIG. 7 illustrates a cross section taken along line 7-7 in FIG. 4A.

FIG. 5 illustrates a cross-section taken along line 5-5 in FIG. 4A. FIG. 6 illustrates a cross-section taken along line 6-6 of FIG. 3. That is, FIG. 6 illustrates a portion of the high-voltage (e.g., bit-line) side of circuit-protection device 300, and thus a portion of the single active region 332, by spanning a plurality of nodes 322 and illustrating a gate (e.g., field-effect transistor) 335 between adjacent nodes 322. FIG. 7 illustrates a cross section taken along line 7-7 in FIG. 4A, and thus illustrates the low-voltage side of a circuit-protection unit 310 and an active region 328. FIGS. 5-7 will now be discussed concurrently.

For some embodiments, each circuit-protection unit 310 may be a field-effect transistor 310, as shown in FIGS. 5 and 7. FIG. 5 illustrates a field-effect transistor 310 from row 312 and a field-effect transistor 310 from row 314, as indicated in parentheses in FIG. 5. Each field-effect transistor 310 may be formed over a semiconductor 500 that may be comprised of silicon, e.g., monocrystalline silicon, and, for example, may be conductively doped to have p-type conductivity, e.g., to form a p-well.

Each field-effect transistor 310 may include a source/drain 510 that corresponds to a node 320. Source/drains 510 may have an n⁻ conductivity type for some embodiments. A region 511 within (e.g., that forms a portion of) a source/drain 510 may have an n⁺ conductivity type and may be coupled to a contact 325. That is, regions 511 may be doped to a higher conductivity levels than source/drains 510. Therefore, source/drains 510 may be coupled to low-voltage circuitry, such as data cache 118 and/or data register 120.

Source/drains 510 may be adjacent to (e.g., may abut) isolation (e.g., STI) regions 512 in semiconductor 500. That is, the isolation regions 330 in FIGS. 1 and 7 may be contiguous with isolation regions 512. Note that the isolation regions 330 define the active region 328 therebetween, as shown in FIG. 7.

The field-effect transistors 310 that form row 312 may have a source/drain 515 that is coupled to (e.g., merges with) a source/drain region of gate 335 that may be configured as a field-effect transistor 335. The field-effect transistors 310 that form row 314 may have a source/drain 515 that is coupled to (e.g., merges with) another source/drain region of field-effect transistor 335. In other words, field-effect transistor 335 shares the one of its source/drains 515 with a field-effect transistor 310 from row 312 and shares the other of its source/drains 515 with a field-effect transistor 310 from row 314.

Source/drains 515 may have an n⁻ conductivity type for some embodiments. A region 517 within (e.g., that forms a portion of) a source/drain 515 may have an n⁺ conductivity type and may be coupled to a contact 327, as shown in FIGS. 5 and 6. That is, regions 517 may be doped to a higher conductivity levels than source/drain 515. Therefore, source/drains 515 may be coupled to bit lines 204.

The field-effect transistors 310 may include a gate dielectric (e.g., a gate oxide) 520 over semiconductor 500 and a control gate 522 over gate dielectric 520, as shown in FIGS. 5 and 7. A control gate 522 may be coupled to or form a portion of a control line 315 (FIGS. 3 and 7). A control gate 522, and thus a control line 315, may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

A channel 528 of a field-effect transistor 310 may be between a source/drain 510 and a source/drain 515, as shown in FIG. 5. In other words, during operation of a field-effect transistor 310, a channel 528 can be formed.

A portion of channel 528 may be doped to have p-type conductivity, where the doped portion may be referred to as a threshold voltage (Vt) implant 530, as shown in FIGS. 5 and 7. For example, channel 528 may be lightly doped to have p-type conductivity so that the corresponding field-effect transistor 310 has a desired threshold voltage.

When a relatively high voltage is applied to a contact 327, and thus a source/drain 515, such as when memory array 104 is erased, field-effect transistor 310 may be selectively turned off so as to protect (e.g., electrically isolate) the low-voltage circuitry coupled to a contact 325, and thus a source/drain 510, from the relatively high voltage. In other words, field-effect transistor 310 can electrically isolate source/drain 510, and thus node 320, from source/drain 515, and thus node 322, when the relatively high voltage is applied to source/drain 515.

When a relatively low voltage is applied to a contact 327, and thus a source/drain 515, such as when memory array 104 is being read or written to, field-effect transistor 310 may be selectively turned on so as to allow the relatively low voltage to be applied to the low-voltage circuitry coupled to a contact 325, and thus a source/drain 510. In other words, field-effect transistor 310 can electrically couple source/drain 510, and thus node 320, to source/drain 515, and thus node 322, when the relatively low voltage is applied to source/drain 515. Note that field-effect transistor 310 may be said to selectively couple a node 320 to a node 322.

The field-effect transistor 335 may include a gate dielectric (e.g., a gate oxide) 540 over semiconductor 500 and a control gate 545 over gate dielectric 540, as shown in FIGS. 5 and 6. A control gate 545 may be coupled to or form a portion of a control line 337 (FIG. 3). Control gate 545, and thus a control line 337, may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

A channel 548 of field-effect transistor 335 may be between source/drains 515. In other words, during operation of field-effect transistor 335, a channel 548 can be formed.

A portion of channel 548 may be doped to have p-type conductivity, where the doped portion may be referred to as a threshold voltage (Vt) implant 550, as shown in FIGS. 5 and 6. For example, channel 548 may be lightly doped to have p-type conductivity so that the field-effect transistor 335 has a desired threshold voltage.

FIG. 6 shows that portions of field-effect transistor 335 are between nodes 322, and thus define nodes 322, on active region 332 on the high-voltage side of circuit-protection device 300. However, on the low-voltage side of circuit-protection device 300, isolation regions 330 formed in semiconductor 500 separate and electrically isolate individual active regions 328 from each other and thus define the individual active regions 328. Note that each active region 328 may include a source/drain 510 and a contact 325. Note that isolation regions 330 may extend into semiconductor 500 below an upper surface of substrate 500 and thus below upper surfaces of active regions 328, as shown in FIG. 7.

Nodes 322 of adjacent circuit-protection units 310 in a single row of circuit-protection units 310 may respectively correspond to the source/drains 515 of field-effect transistor 335. That is, one of the source/drains 515 of field-effect transistor 335 may correspond to a node 322 of a circuit-protection unit 310 and the other source/drain 515 of field-effect transistor 335 may correspond to a node 322 of an adjacent circuit-protection unit 310 in the same row of circuit-protection units 310, as shown in FIG. 6. Note that a row of circuit-protection units 310 are commonly coupled to a control line 315, as shown in FIG. 3 for rows 312 and 314. Note further that a node 322 of a circuit-protection unit 310 may include a first source/drain of field-effect transistor 335 and a node 322 of an adjacent circuit-protection unit 310 in the same row (FIG. 6) or in a different row (FIG. 5) may include a second source/drain of field-effect transistor 335.

When source/drains 515 are at relatively high voltages, such as during an erase operation on memory array 104, a voltage, sufficient to turn on field-effect transistor 335, may be selectively applied to control gate 545 of field-effect transistor 335, thereby electrically coupling nodes 322. Alternatively, control gate 545 may be selectively allowed to float so that the relatively high voltages on source/drains 515 can act to pull up field-effect transistor 335 to a voltage sufficient to turn on field-effect transistor 335, thereby electrically coupling nodes 322.

When a source/drain 515 is at relatively low voltage, such as during a write or read operation on a memory array, control gate 545 of field-effect transistor 335 may be selectively grounded so that field-effect transistor 335 is off, thereby electrically isolating nodes 322 from each other. As such, field-effect transistor 335 may be said to selectively couple nodes 322 to each other. For example, adjacent nodes 322 on either side of field-effect transistor 335 (e.g., in the vertical, horizontal, and/or diagonal directions in frame of reference of FIG. 3) may be at different voltages during a write or read operation, and isolating these nodes 322 from each other using field-effect transistor 335 acts to prevent the voltage on one of the nodes from affecting the voltage on the other node.

Figure 8:
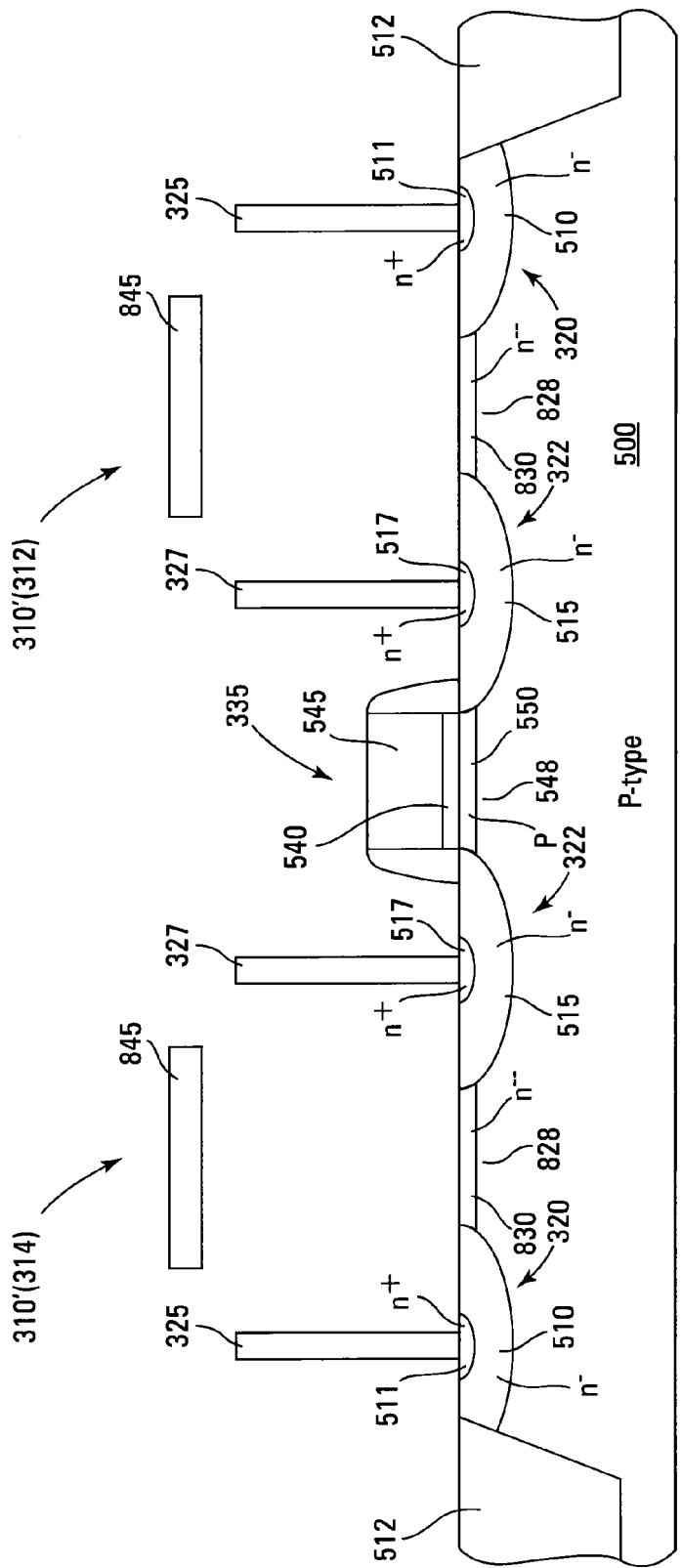
FIG. 8 is a cross-section taken along line 8-8 in FIG. 4B.

For other embodiments, rows 312 and 314 of circuit-protection device 300 may include circuit-protection units 310' instead of circuit-protection units 310. FIG. 4B is analogous to FIG. 4A and illustrates circuit-protection units 310' of rows 312 and 314. FIG. 8 is a cross-section taken along line 8-8 in FIG. 4B, and FIG. 9 is a cross-section taken along line 9-9 in FIG. 4B. Common numbering is used in FIGS. 3, 4A, and 5-7 and in FIGS. 4B and 8-9 to denote similar (e.g., the same) elements, e.g., as described above in conjunction with FIGS. 3, 4A, and 5-7. Note that the portion of active region 332 of circuit-protection device 300 corresponding to the cross-section of FIG. 6 taken along line 6-6 in FIG. 3 remains substantially the same (e.g., the same) for embodiments with circuit-protection units 310 and circuit-protection units 310'.

Circuit-protection units 310' may be depletion-mode-field-effect transistors 310', such as metal-gate-depletion-mode-field-effect transistors, for some embodiments. Each depletion-mode-field-effect transistor 310' may include the source/drain regions 510 and 515 on either side thereof.

A field-effect transistor 310' may be turned off when a relatively high voltage is on a contact 327, such as during erasure of memory array 104, so as to electrically isolate contact 327 from contact 325. A field-effect transistor 310' may be turned on when a relatively low voltage is on contact 327, such as while reading or writing to memory array 104, so as to electrically couple contact 327 to contact 325.

A channel 828 of a field-effect transistor 310' may be between a source/drain 510 and a source/drain 515. In other words, during operation of a field-effect transistor 310', a channel 828 can be formed. A portion of channel 828 may be doped to have a conductivity type, e.g., an $n^{--}$-type conductivity, where the doped portion may be referred to as a depletion region 830, as shown in FIGS. 8 and 9.

A control gate 845 may be over depletion region 830. For example, control gate 845 may be metal, such as aluminum, copper, etc., or may comprise, consist of, or consist essentially of metal, such as a refractory metal, or a metal-containing material, such as a refractory metal silicide or a metal nitride, e.g., a refractory metal nitride, as well as any other conductive material.

A dielectric may be between control gate 845 and depletion region 830. Isolation regions 330 formed in semiconductor 500 define individual active regions 328' therebetween on the low-voltage side of circuit-protection device 300, as shown in FIG. 9 for a single active region 328'. A field-effect transistor 310' is over each active region field-effect transistor 310'. Note that active regions 328' are analogous to active regions 328 in FIGS. 3 and 7. As such, each active region 328' may include a source/drain 510 and a contact 325.

The control gates 845 of the field-effect transistors 310' in a row of field-effect transistors 310' may be coupled to each other, e.g., to form a control line commonly coupled field-effect transistors 310' in the respective row. For example, the control gates 845 of the field-effect transistors 310' in row 312 may be coupled to each other, e.g., to form a control line commonly coupled field-effect transistors 310' in row 312, and the control gates 845 of the field-effect transistors 310' in row 314 may be coupled to each other, e.g., to form a control line commonly coupled field-effect transistors 310' in row 314.

Figure 10:
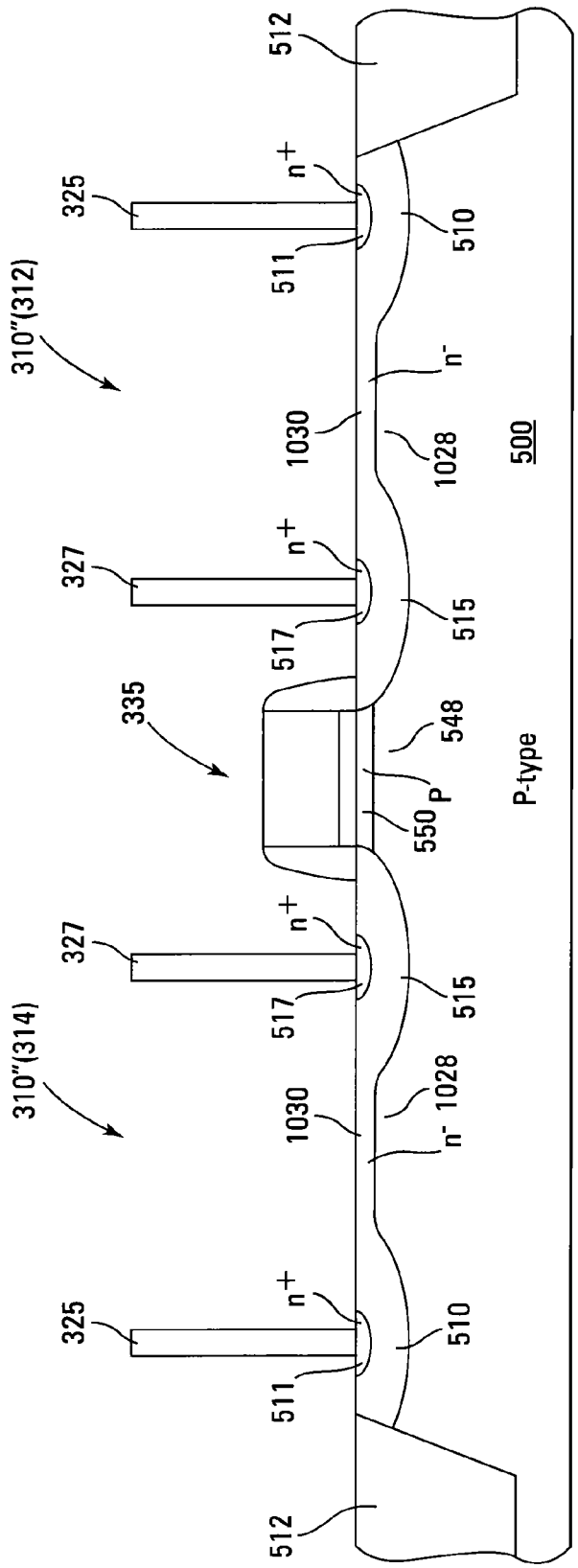
FIG. 10 is a cross-section taken along line 10-10 in FIG. 4C.
Figure 11:
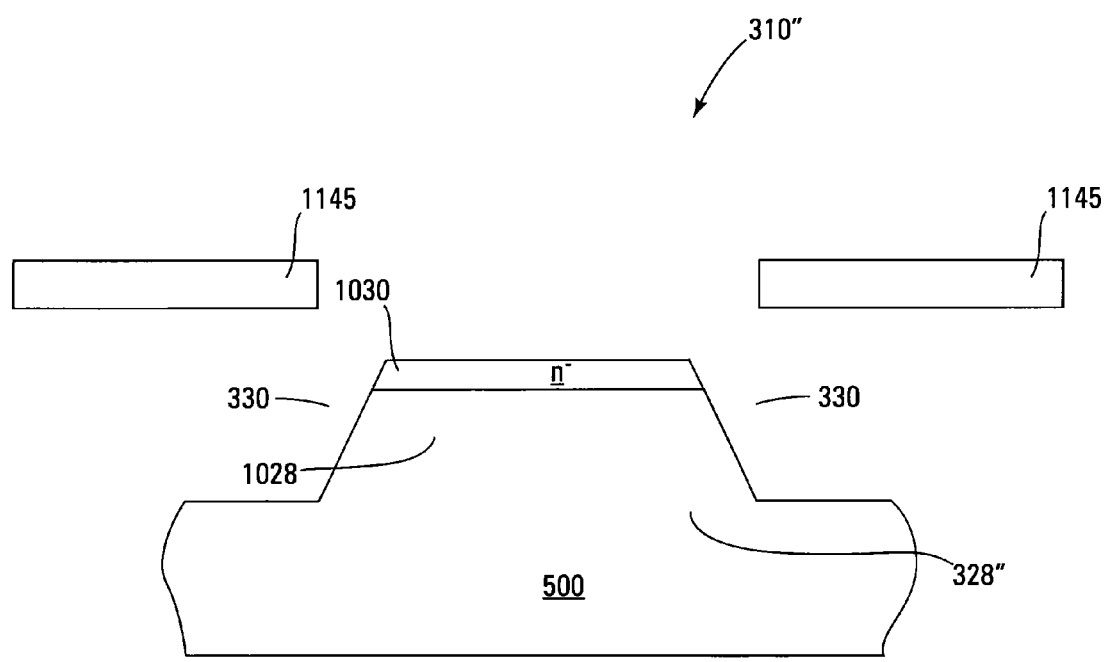
FIG. 11 is a cross-section taken along line 11-11 in FIG. 4C.

For further embodiments, rows 312 and 314 of circuit-protection device 300 may include circuit-protection units 310" instead of circuit-protection units 310. FIG. 4C is analogous to FIG. 4A and illustrates circuit-protection units 310" of rows 312 and 314. FIG. 10 is a cross-section taken along line 10-10 in FIG. 4C, and FIG. 11 is a cross-section taken along line 11-11 in FIG. 4C. Common numbering is used in FIGS. 3, 4A, and 5-7 and in FIGS. 4C and 10-11 to denote similar (e.g., the same) elements, e.g., as described above in conjunction with FIGS. 3, 4A, and 5-7. Note that the portion of active region 332 of circuit-protection device 300 corresponding to the cross-section of FIG. 6 taken along line 6-6 in FIG. 3 remains substantially the same for embodiments with circuit-protection units 310 and circuit-protection units 310".

Circuit-protection units 310" may be lateral-gate-depletion-mode-field-effect transistors 310". Each field-effect transistor 310" may include the source/drain regions 510 and 515 on either side thereof.

A field-effect transistor 310" may be turned off when a relatively high voltage is on a contact 327, such as during erasure of memory array 104, so as to electrically isolate contact 327 from contact 325. A field-effect transistor 310" may be turned on when a relatively low voltage is on contact 327, such as while reading or writing to memory array 104, so as to electrically couple contact 327 to contact 325.

A channel 1028 of a field-effect transistor 310" may be between a source/drain 510 and a source/drain 515. In other words, during operation of a field-effect transistor 310", a channel 1028 can be formed. A portion of channel 1028 may be doped to have a conductivity type, e.g., an $n^-$-type conductivity, where the doped portion may be referred to as a depletion region 1030, as shown in FIGS. 10 and 11.

Portions of a control gate 1145 may be above and on either side of depletion region 1030 and thus channel 1028, as shown in FIG. 11. Control gate 1145 may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

Portions of control gate 1145 may be displaced laterally from either side of depletion region 1030. Isolation regions 330 formed in semiconductor 500 define individual active regions 328" therebetween on the low-voltage side of circuit-protection device 300, as shown in FIG. 11 for a single active region 328". Note that active regions 328" are analogous to active regions 328 in FIGS. 3 and 7. As such, each active region 328" may include a source/drain 510 and a contact 325.

Figure 12:
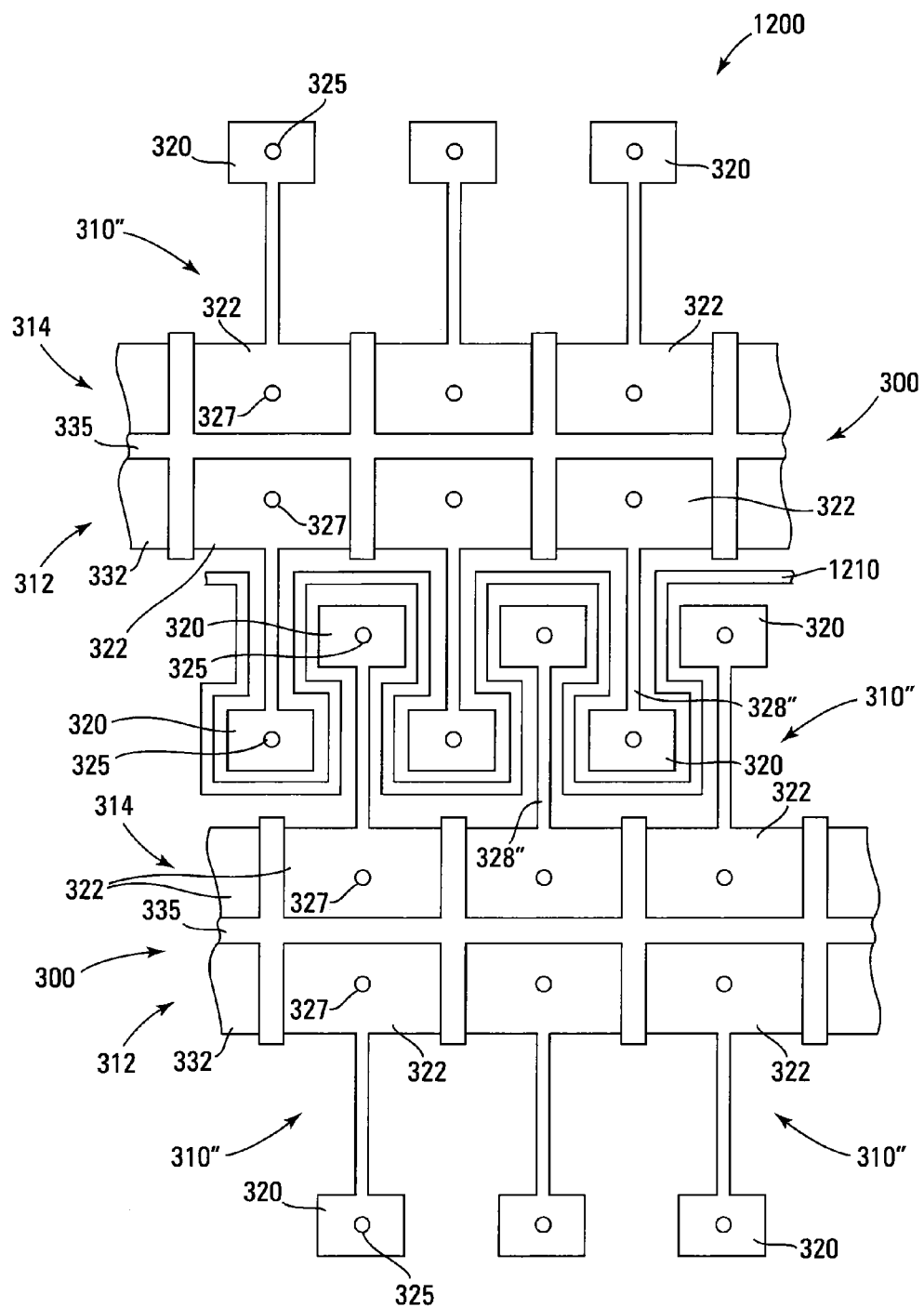
FIG. 12 is a top plan view of a circuit-protection system, according to another embodiment.

FIG. 12 is a top plan view of a circuit-protection system (e.g., an interleaved circuit-protection system) 1200, e.g., that may also be referred to as an interleaved high-voltage isolation system. Common numbering is used to denote similar (e.g., the same) elements in FIG. 12 and FIGS. 3, 4A, 5, 6, 4C, 10, and 11, e.g., as described above in conjunction with FIGS. 3, 4A, 5, 6, 4C, 10, and 11.

Circuit-protection system 1200 may include a plurality of circuit-protection devices 300, as described above, that may be interleaved. For example, each circuit-protection device 300 may include rows 312 and 314 of lateral-gate-depletion-mode-field-effect transistors 310", e.g., as described above in conjunction with FIGS. 4C, 10, and 11. In other words, circuit-protection system 1200 may include a plurality of circuit-protection devices 300 that are configured with lateral-gate-depletion-mode-circuit-protection units.

The nodes 320 extending from one of the circuit-protection devices 300 may be interleaved with the nodes 320 extending from another one (e.g., an adjacent one) of the circuit-protection devices 300, as shown in FIG. 12. In other words, the nodes 320 extending from one of the circuit-protection devices 300 may be interposed between a pair successively adjacent nodes 320 extending from the another circuit-protection device 300.

A control line 1210, e.g., having serpentine configuration, may wrap around portions of the interleaved nodes 320. The control gates 1145 (FIG. 11) of the field-effect transistors 310" whose nodes 320 are interleaved may be coupled to, or may form a portion of, control line 1210. For example, control line 1210 may wrap around the portions the interleaved nodes 320 extending from the adjacent circuit-protection devices 300 so that the field-effect transistors 310" of the adjacent circuit-protection devices 300 whose nodes 320 are interleaved share a portion of (e.g., are commonly coupled to) control line 1210. Note that control line 1210 is displaced laterally from the individual active regions 328" on the low-voltage sides of the adjacent circuit-protection devices 300.

CONCLUSION

Although specific embodiments have been illustrated and described herein, it will be appreciated by those of ordinary skill in the art that any arrangement that is calculated to achieve a similar (e.g., the same) purpose may be substituted for the specific embodiments shown. For example, for other embodiments, enhancement-mode-field-effect transistors may be substituted for the depletion-mode-field-effect transistors described above. For example, metal-gate-enhancement-mode-field-effect transistors may be substituted for the metal-gate-depletion-mode-field-effect transistors described above in conjunction with FIGS. 4B, 8, and 9, and lateral-gate-enhancement-mode-field-effect transistors may be substituted for the lateral-gate-depletion-mode-field-effect transistors described above in conjunction with FIGS. 4C, 10, 11, and 12. Accordingly, this application is intended to cover any adaptations or variations of the embodiments.

What is claimed is:

1. A circuit-protection device, comprising:
   first and second circuit-protection units, each comprising first and second nodes; and
   a gate that selectively electrically couples the first node of the first circuit-protection unit to the first node of the second circuit-protection unit in response to a voltage that is selectively applied to a control gate of the gate while a voltage is applied to the first node of the first circuit-protection unit and while a voltage is applied to the first node of the second circuit-protection unit, wherein the voltage that is selectively applied to the control gate of the gate is applied-separately from the voltage applied to the first node of the first circuit-protection unit and separately from the voltage applied to the first node of the second circuit-protection unit;

wherein the first nodes of first and second circuit-protection units are on a common active region of a single conductivity type; and wherein the gate is configured to electrically isolate the first nodes of first and second circuit-protection units from each other when the first nodes of first and second circuit-protection units are at different voltages and to couple the first nodes of first and second circuit-protection units when the first nodes of first and second circuit-protection units are at about a same voltage that is higher than either of the different voltages.

2. The circuit-protection device of claim 1, wherein the second nodes of first and second circuit-protection units are on separate first and second active regions.

3. The circuit-protection device of claim 2, further comprising an isolation region between the first and second active regions.

4. The circuit-protection device of claim 2, wherein the common active region and the first active region are contiguous, and wherein the common active region and the second active region are contiguous.

5. The circuit-protection device of claim 1, wherein the first and second circuit-protection units are commonly coupled to a control line.

6. The circuit-protection device of claim 1, wherein the first and second circuit-protection units are coupled to different control lines.

7. The circuit-protection device of claim 1, wherein the first and second circuit-protection units and the gate are field-effect transistors.

8. The circuit-protection device of claim 1, wherein the first and second circuit-protection units are field-effect transistors selected from the group consisting of depletion-mode-field-effect transistors, metal-gate-depletion-mode-field-effect transistors, lateral-gate-depletion-mode-field-effect transistors, enhancement-mode-field-effect transistors, metal-gate-enhancement-mode-field-effect transistors, and lateral-gate-enhancement-mode-field-effect transistors.

9. A circuit-protection device, comprising:
first and second circuit-protection units, each comprising first and second nodes; and
a gate coupled to the first nodes of first and second circuit-protection units;
wherein the first nodes of first and second circuit-protection units are on a common active region; and
wherein the gate is configured to electrically isolate the first nodes of first and second circuit-protection units from each other when the first nodes of first and second circuit-protection units are at different voltages and to couple the first nodes of first and second circuit-protection units when the first nodes of first and second circuit-protection units are at about a same voltage that is higher than either of the different voltages.

10. The circuit-protection device of claim 9, wherein the gate being configured to couple the first nodes of first and second circuit-protection units when the first nodes of first and second circuit-protection units are at about a same voltage comprises the gate being configured to be selectively allowed to float.

11. The circuit-protection device of claim 10, wherein the about the same voltage of the first nodes of the first and second circuit-protection units pull up the gate configured to be selectively allowed to float to a voltage sufficient to turn on the gate.

12. A circuit-protection device, comprising:
first and second circuit-protection units, each comprising first and second nodes; and
a gate coupled to the first nodes of first and second circuit-protection units;
wherein the gate is configured to selectively electrically couple the first node of the first circuit-protection unit to the first node of the second circuit-protection unit in response to a voltage that is selectively applied to a control gate of the gate while a voltage is applied to the first node of the first circuit-protection unit and while a voltage is applied to the first node of the second circuit-protection unit, wherein the voltage that is selectively applied to the control gate of the gate is applied separately from the voltage applied to the first node of the first circuit-protection unit and separately from the voltage applied to the first node of the second circuit-protection unit;
wherein the first nodes of first and second circuit-protection units are on a common active region of a single conductivity type;
wherein the first node of the first circuit-protection unit comprises a first source/drain of the gate and the first node of the second circuit-protection unit comprises a second source/drain of the gate; and
wherein the gate is configured to electrically isolate the first nodes of first and second circuit-protection units from each other when the first nodes of first and second circuit-protection units are at different voltages and to couple the first nodes of first and second circuit-protection units when the first nodes of first and second circuit-protection units are at about a same voltage that is higher than either of the different voltages.

13. The circuit-protection device of claim 12, further comprising contacts coupled to the first and second source/drains of the gate.

14. The circuit-protection device of claim 13, wherein the first and second source/drains of the gate comprise regions that are doped to higher conductivity levels than the first and second source/drains, wherein the regions are coupled to the contacts.

15. A circuit-protection device, comprising:
first and second circuit-protection units, each comprising first and second nodes; and
a gate coupled to the first nodes of first and second circuit-protection units;
wherein the first nodes of first and second circuit-protection units are on a common active region; and
wherein the first nodes of first and second circuit-protection units are coupled to data lines of a memory array, and wherein the second nodes of first and second circuit-protection units are coupled to a data cache and/or a data register.

16. The circuit-protection device of claim 15, wherein the gate is configured to electrically isolate the first nodes of first and second circuit-protection units from each other while the memory array is being read from or written to and configured to couple the first nodes of first and second circuit-protection units while the memory array is being erased.

17. A circuit-protection device, comprising:
first and second circuit-protection units, each comprising first and second nodes; and
a gate coupled to the first nodes of first and second circuit-protection units;
wherein the first nodes of first and second circuit-protection units are on a common active region; and
wherein the second nodes of the first and second circuit-protection units are configured to be coupled to low-voltage circuitry and the first nodes of the first and second circuit-protection units are configured to be respectively coupled to circuitries that can be at high voltages or at different low voltages.

18. A memory device having a circuit-protection device, comprising:
   first and second transistors, each comprising first and second source/drains; and
   a third transistor between the first source/drains of first and second transistors, the third transistor comprising a first source/drain coupled to the first source/drain of the first transistor and a second source/drain coupled to the first source/drain of the second transistor;
   wherein the first source/drains of first and second transistors and the first and second source/drains of the third transistor are formed in a common active region and wherein the third transistor is over the common active region; and
   wherein the first source/drains of first and second transistors are coupled to data lines of the memory device.

19. The memory device of claim 18, wherein the second source/drains of first and second transistors are coupled to low-voltage circuitry of the memory device.

20. The memory device of claim 18, wherein the second source/drains of first and second transistors are respectively formed in first and second active regions that are separated by an isolation region.

21. The memory device of claim 18, wherein the first and second transistors are commonly coupled to a control line.

22. The memory device of claim 18, wherein the first and second transistors are coupled to different control lines.

23. The memory device of claim 18, further comprising contacts coupled to the first and second source/drains of the first and second transistors.

24. The memory device of claim 23, wherein the first and second source/drains of the first and second transistors comprise regions that are doped to higher conductivity levels than the first and second source/drains of the first and second transistors, wherein the regions are coupled to the contacts.

25. A circuit-protection system, comprising:
   first and second circuit-protection devices, each first and second circuit-protection device comprising:
      successively adjacent first and second circuit-protection units, each of the first and second circuit-protection units between and coupled to first and second nodes; and
      a gate between and coupled to the first nodes coupled to the successively adjacent first and second circuit-protection units of the respective circuit-protection device;
   wherein the first nodes are in a common active region of the respective circuit-protection device; and
   wherein the second node coupled to the first circuit-protection unit of the second circuit-protection device is between the second nodes coupled to the first and second circuit-protection units of the first circuit-protection device.

26. The circuit-protection system, of claim 25, wherein the first and second circuit-protection units of the first and second circuit-protection devices are lateral-gate-field-effect transistors.

27. The circuit-protection system, of claim 25, further comprising a control line that wraps around the second node coupled to the first circuit-protection unit of the second circuit-protection device that is between the second nodes coupled to the first and second circuit-protection units of the first circuit-protection device and around the second nodes coupled to the first and second circuit-protection units of the first circuit-protection device.

28. The circuit-protection system, of claim 27, wherein the first and second circuit-protection units of the first and second circuit-protection devices are commonly coupled to the control line.

29. The circuit-protection system, of claim 27, wherein the first and second circuit-protection units of the first and second circuit-protection devices each comprise a depletion region coupled to the first and second nodes.

30. The circuit-protection system, of claim 27, wherein the second nodes coupled to the first and second circuit-protection units of the first circuit-protection device are respectively formed in separate active regions that extend from the common active region of the first circuit-protection device, and wherein the second nodes coupled to the first and second circuit-protection units of the second circuit-protection device are respectively formed in separate active regions that extend from the common active region of the second circuit-protection device.

31. The circuit-protection system, of claim 25, wherein the second node coupled to the first circuit-protection unit of the first circuit-protection device is between the second nodes coupled to the first and second circuit-protection units of the second circuit-protection device.

* * * * *